(12) United States Patent
Drzymala et al.

(10) Patent No.: US 9,064,765 B2
(45) Date of Patent: Jun. 23, 2015

(54) HANDHELD IMAGING APPARATUS FOR, AND METHOD OF, IMAGING TARGETS USING A HIGH PERFORMANCE, COMPACT SCAN ENGINE

(71) Applicant: Symbol Technologies, Inc., Schaumburg, IL (US)

(72) Inventors: Mark E. Drzymala, St. James, NY (US); Edward D. Barkan, Miller Place, NY (US); Igor R. Vinogradov, Oakdale, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 297 days.

(21) Appl. No.: 13/873,440

(22) Filed: Apr. 30, 2013

(65) Prior Publication Data

US 2014/0048687 A1    Feb. 20, 2014

Related U.S. Application Data

(63) Continuation-in-part of application No. 13/584,948, filed on Aug. 14, 2012, now Pat. No. 8,835,825.

(51) Int. Cl.
*H01L 27/146* (2006.01)
*G06K 7/10* (2006.01)

(52) U.S. Cl.
CPC ...... *H01L 27/14625* (2013.01); *G06K 7/10722* (2013.01); *G06K 7/10881* (2013.01)

(58) Field of Classification Search
CPC .......... G06K 7/10732; G06K 7/10831; G06K 7/10881; G06K 7/10722
See application file for complete search history.

(56) References Cited

U.S. PATENT DOCUMENTS 7,616,393 B2    11/2009 Border et al.
7,773,229 B2     8/2010 Harlander et al.
(Continued)

FOREIGN PATENT DOCUMENTS

EP         2469852 A1     6/2012
WO     WO 2006068848 A1 *  6/2006
(Continued)

OTHER PUBLICATIONS

International Search Report and Written Opinion for counterpart International Patent Application No. PCT/US2013/053149 mailed Nov. 6, 2013.

(Continued)

*Primary Examiner* — Tony Ko

(57) ABSTRACT

An apparatus for, and a method of, electro-optically reading a target by image capture, employ a scan engine in a handheld housing having a tilted handle. A single tilted printed circuit board (PCB) in the handle has front and rear surfaces that respectively face toward and away from the target during reading. An optical assembly having a pair of fold mirrors is mounted on the rear surface, for receiving return light from the target through an aperture in the PCB along the horizontal, and for directing the return light along an internal folded optical path. An imaging lens assembly is mounted between the fold mirrors and has an imaging axis that extends generally parallel to the PCB. The imaging lens assembly projects the return light onto a solid-state, two-dimensional, image sensor to enable the return light to be detected over a field of view, and to generate an electrical signal indicative of the detected return light.

20 Claims, 9 Drawing Sheets

(56) References Cited

U.S. PATENT DOCUMENTS

| | | |
|---|---|---|
| 7,907,331 B2 | 3/2011 | Maram et al. |
| 8,130,436 B2 | 3/2012 | Borchers |
| 8,155,514 B1 | 4/2012 | Chow et al. |
| 8,203,616 B2 | 6/2012 | Barkan et al. |
| 8,919,651 B2 * | 12/2014 | Gao et al. .................. 235/454 |
| 2002/0148901 A1 | 10/2002 | Barkan et al. |
| 2012/0018516 A1 | 1/2012 | Gao et al. |
| 2012/0118962 A1 | 5/2012 | Barkan et al. |

FOREIGN PATENT DOCUMENTS

| | | |
|---|---|---|
| WO | 2010150071 A1 | 12/2010 |
| WO | WO 2011152853 A1 * | 12/2011 |

OTHER PUBLICATIONS

"7580 Genesis," Honeywell Scanning and Mobility, accessed at www.honeywellaidc.com, accessed on Aug. 14, 2012, 1 page.

* cited by examiner

HANDHELD IMAGING APPARATUS FOR, AND METHOD OF, IMAGING TARGETS USING A HIGH PERFORMANCE, COMPACT SCAN ENGINE

CROSS-REFERENCE TO RELATED APPLICATION

The present application is a continuation-in-part of, and claims the benefit under 35 U.S.C. §119(e) from, U.S. patent application Ser. No. 13/584,948, filed Aug. 14, 2012, entitled "High Performance Scan Engine with Rear-facing Image Sensor in Handheld Arrangement For, and Method Of, Imaging Targets Using the Scan Engine" ("parent application"), and contains at least a claim to a claimed invention that has an effective filing date as defined in 35 U.S.C. 100(i) that is on or after Mar. 16, 2013, the present application being commonly owned with said parent application by Symbol Technologies, Inc., the entire contents of said parent application being incorporated herein by reference thereto.

FIELD OF THE DISCLOSURE

The present disclosure relates generally to a compact scan engine having a rear-facing image sensor and an apparatus for, and a method of, imaging targets using the compact scan engine and, more particularly, to a high performance, compact, inexpensive, durable, and handheld, area imaging reader for electro-optically reading symbol targets to be decoded and/or non-symbol targets or forms to be imaged.

BACKGROUND

Solid-state imaging systems or imaging readers have been used, in both handheld and/or hands-free modes of operation, to electro-optically read targets, such as one- and two-dimensional bar code symbols, each bearing elements, e.g., bars and spaces, of different widths and reflectivities, to be decoded, as well as non-symbol targets or forms, such as documents, labels, receipts, signatures, drivers' licenses, employee badges, and payment/loyalty cards, each bearing alphanumeric characters, to be imaged. A known exemplary imaging reader includes a housing either held by a user and/or supported on a support surface, a front window supported by the housing and aimed at the target, and a scan engine or imaging module supported by the housing and having a solid-state imager (or image sensor) with a sensor array of photocells or light sensors (also known as pixels) that lie in an imaging plane and face forwardly toward the front window, and an imaging lens assembly for capturing return light scattered and/or reflected from the target being imaged through the window over a field of view, and for projecting the return light onto the image sensor along an internal optical path between the window and the image sensor, to initiate capture of an image of the target over a range of working distances in which the target can be read. The imaging lens assembly includes a plurality of lenses arranged along an imaging axis that is generally perpendicular to the imaging plane of the image sensor. Such an image sensor may include a one- or two-dimensional charge coupled device (CCD) or a complementary metal oxide semiconductor (CMOS) device and associated circuits for producing and processing electrical signals corresponding to a one- or two-dimensional array of pixel data over the field of view. These electrical signals are decoded and/or processed by a programmed microprocessor or controller into information related to the target being read, e.g., decoded data indicative of a symbol target, or into a picture of a non-symbol target.

In order to increase the amount of the return light captured by the image sensor, especially in dimly lit environments and/or at far range imaging and reading, the known imaging reader may also have an illuminating light assembly, which also faces forwardly toward the front window, for illuminating the target with illumination light from an illuminating light source, e.g., one or more light emitting diodes (LEDs) and illuminating lenses, for reflection and scattering from the target. The known imaging reader may also have an aiming light assembly, which also faces forwardly toward the front window, for projecting an aiming light pattern or mark, such as a "crosshair" pattern, with aiming light from an aiming light source, e.g., an aiming laser or one or more LEDs, through aiming lenses on the target prior to imaging. The user aims the aiming pattern on the target to be imaged during an aiming mode prior to imaging and reading.

In the hands-free mode, the user may slide or swipe the target past the window in either horizontal and/or vertical and/or diagonal directions in a "swipe" mode. Alternatively, the user may present the target to an approximate central region of the window in a "presentation" mode. The choice depends on the type of target, operator preference, or on the layout of a workstation in which the reader is used. In the handheld mode, the user holds the reader in his or her hand at a certain distance from the target to be imaged and initially aims the reader at the target. The user may first lift the reader from a countertop or a support stand or cradle. Once reading is completed, the user may return the reader to the countertop or to the support stand to resume hands-free operation.

Thus, handheld imaging readers having a two-dimensional imager, also known as area readers, have become increasingly popular in the last several years due to their ability to scan two-dimensional symbol targets, and also to omni-directionally read one-dimensional symbol targets, and also to take pictures of non-symbol targets or forms. Yet, despite these advantages, adoption of area readers still lags behind imaging readers having a one-dimensional imager, also known as linear readers, as well as laser-based readers, because the area readers cost more and have certain performance issues, such as a smaller working distance range.

One factor that limits the working distance range of existing handheld area readers is pixel resolution of the image sensor. Pixel resolution refers to the size of the smallest detail that the image sensor can resolve (assuming focus is adequate) and is determined by the size of a detail in the image projected onto the image sensor. In the case of reading symbol targets, the image of the symbol target on the image sensor grows smaller as the distance to the symbol target is increased. When the width of the image of an element (bar or space) in the symbol target approaches (for instance) around the same size as a pixel, then the end of the working distance range has been reached, simply because if the symbol target moves any further away than that, then that element can no longer be resolved by the image sensor. The pixel resolution limits the working distance range, because the internal optical path distance between the front window of the reader and the imaging lens assembly is limited by the size of the reader housing, and causes the field of view to be unnecessarily wide.

Typically, the image sensor is positioned about 2.5 inches back from the front of the reader housing due to a practical, ergonomic requirement to build the reader housing with a size that users have become accustomed to with previous generations of reader technology. Another user expectation is that the working distance range begins very close to a front end, or nose, of the housing, because many users will naturally position the target close-up to the nose when attempting to scan the target. In order for a symbol target to be scanned close to the nose, the field of view must be able to expand to be at least about 1.75 inches in a horizontal direction across the nose. If the field of view is much smaller than that, then it may not entirely cover common symbol targets, and such symbol targets will not be read. This requirement, along with the positioning of the image sensor inside the housing, results in a need to make the field of view expand at an angle of around 40 degrees horizontally, which is typical of all general purpose handheld area readers that are available at this time.

Sometimes, it is desirable for the reader to scan a target at a distance well away from the nose, for example, when scanning a heavy or bulky item that is too difficult, or inconvenient, to lift out of a shopping cart onto a check-out counter. Thus, the handheld reader will often be called upon to read both close-in and far-out targets. With the typical field of view angle of about forty degrees, the field of view will diverge rapidly as the target distance increases, and the pixel resolution will fall off correspondingly. All area readers would benefit if the rate of divergence of the field of view could be reduced, since that would mean that the size of the image on the image sensor will not grow smaller as quickly when the target distance to the target is increased.

Aside from pixel resolution, another factor that limits the working distance range is depth of focus of the imaging lens assembly. When the imaging lens assembly is focused farther away from the image sensor, the depth of focus is increased. The working distance range may be increased simply by focusing the imaging lens assembly farther away from the nose. However, this solution has not been utilized in existing handheld readers, because it will reduce the sharpness of the image close-up to the nose, thereby preventing reading of some close-in targets.

Another performance issue with existing area readers relates to parallax involving the aforementioned aiming light assembly. Since the outgoing aiming light cannot coexist with the incoming return light projected onto the image sensor in the same place, the aiming light sources must always be positioned to one side (or above or below) the image sensor. It is desirable that the aiming light be visible close to the center of the field of view of the image sensor at a distance away from the reader. The aiming light on existing scanners is therefore directed at a slight angle with respect to an imaging axis of the imaging lens assembly, so as to converge the aiming light on the center of the field of view at a convenient distance away from the reader. Unfortunately, this results in the aiming light being off-center at all other distances, and the larger the angular difference between the aiming light assembly and the imaging lens assembly, the faster the aiming light goes off-center.

As previously mentioned, the known area readers are expensive not only in terms of component cost, but also in terms of the labor cost of assembling and aligning their various components. Unlike linear readers and laser-based readers, optical and ergonomic constraints have compelled the use of multiple printed circuit boards (PCBs) interconnected by flexible wiring, such as ribbon cables, and connectors inside the handheld area readers. The image sensor is typically mounted on one of the PCBs, while other components, e.g., the illumination LEDs or the imaging lens assembly, are mounted on another of the PCBs. In an area reader, the image sensor must be positioned in a plane perpendicular to the imaging axis of the imaging lens assembly. This imaging axis projects out of the front of the housing at an angle that is typically tilted by around fifteen to about twenty-two degrees with respect to the handle of the housing, for ergonomic reasons. In order to totally eliminate all internal flexible wiring and secondary PCBs, a single PCB must extend from a bottom of the handle (where an interface cable is connected) to a top of the housing (where success indicator LEDs for the human interface reside for visibility). The fifteen to twenty-two degree tilt of the handle forces this single PCB to be tilted by this same angle with respect to the imaging axis of the imaging lens assembly, thereby requiring that the known imaging lens system be placed on a secondary PCB tilted by that angle with respect to the main PCB. Multiple PCBs decrease reliability.

The market for handheld area readers is growing, but market growth is hampered not only by the relatively high cost of the scan engines, as driven by their complex electro-mechanical structure that employs multiple PCBs and/or ribbon cable interconnects and/or multiple connectors, alignment fixtures, etc, but also by performance issues, such as a limited working distance range due to pixel resolution constraints and depth of focus constraints, as well as by parallax issues. Accordingly, there is a need to provide a compact, low cost, high performance, and durable scan engine and an apparatus for, and a method of, electro-optically reading a target by image capture employing the compact scan engine in a handheld reader that would spur market growth.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
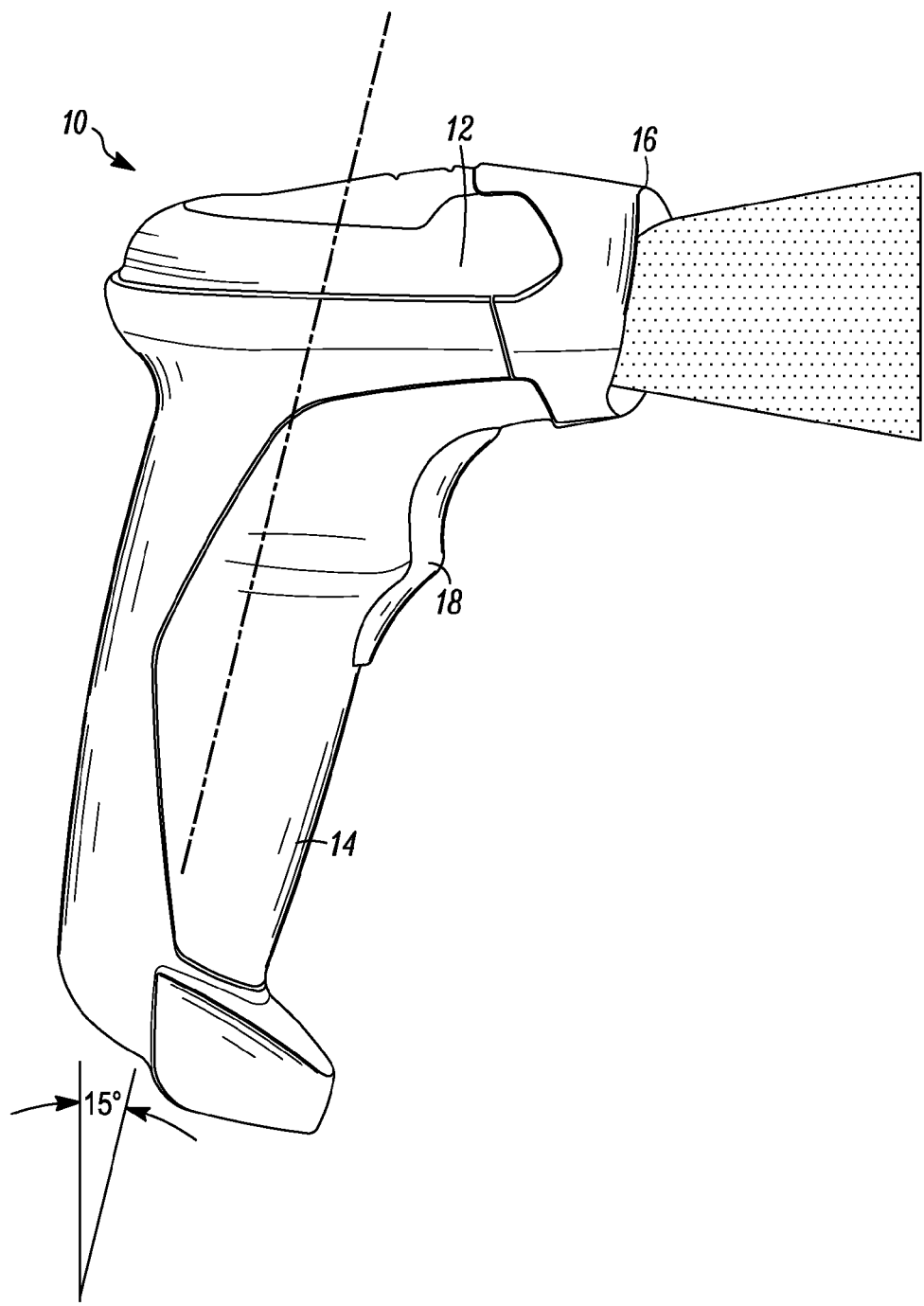
FIG. 1 is a side view of a handheld area reader for electro-optically reading targets by image capture in accordance with this disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

One aspect of this disclosure relates to a compact scan engine for electro-optically imaging a target. The scan engine includes a single printed circuit board (PCB) tilted at an acute angle of inclination relative to the vertical and having a tilted front surface that faces the target during imaging, and a tilted rear surface that faces away from the target during imaging. The PCB also has an aperture that extends through the PCB between the tilted front and rear surfaces. A solid-state image sensor is mounted on the tilted rear surface and has a two-dimensional sensor array with a field of view. An optical assembly, including a pair of fold mirrors, is mounted on the tilted rear surface. The fold mirrors are arranged relative to each other and relative to the image sensor, for receiving return light returning from the target and passing through the aperture along the horizontal, and for directing the return light along a folded optical path. An imaging lens assembly is mounted in the folded optical path between the fold mirrors and has an imaging axis that is generally parallel to the PCB, and is operative for projecting the return light onto the image sensor to enable the image sensor to detect the return light over the field of view, and to generate an electrical signal indicative of the detected return light. The imaging lens assembly In accordance with another aspect of this disclosure, the scan engine is mounted in a handheld reader for electro-optically reading the target. The reader includes a housing having a front end, a light-transmissive window supported at the front end, and a handle for holding the housing in a handheld mode of operation. The PCB is mounted in the handle, both of which are tilted at the same acute angle of inclination relative to the vertical. The return light returning from the target passes through the window along an internal folded optical path that extends between the window and the image sensor in the scan engine. The imaging lens assembly is mounted in the folded optical path between the fold mirrors in the scan engine, and the imaging axis of the imaging lens assembly is generally parallel to the PCB in the scan engine. A controller is also mounted on the PCB and is operatively connected to, and controls operation of, the scan engine, for processing the electrical signal into data indicative of the target being imaged.

In accordance with still another aspect of this disclosure, a method of electro-optically reading a target by image capture is performed by supporting a light-transmissive window at a front end of a housing, holding the housing in a handheld mode of operation with a handle tilted at an acute angle of inclination relative to the vertical, mounting a single printed circuit board (PCB) in the handle, tilting the PCB at the same angle of inclination, the PCB having a tilted front surface that faces the target during imaging, and a tilted rear surface that faces away from the target during imaging, forming an aperture to extend through the PCB between the tilted front and rear surfaces, mounting a solid-state image sensor having a two-dimensional sensor array with a field of view on the tilted rear surface, receiving return light returning from the target through the window and passing through the aperture along the horizontal, directing the return light along an internal folded optical path by mounting a pair of fold mirrors on the tilted rear surface, projecting the return light onto the image sensor by mounting an imaging lens assembly having an imaging axis in the internal folded optical path between the fold mirrors, and by positioning the imaging axis to lie generally parallel to the PCB, to enable the image sensor to detect the return light over the field of view, and to generate an electrical signal indicative of the detected return light, and processing the electrical signal into data indicative of the target being imaged.

Figure 2:
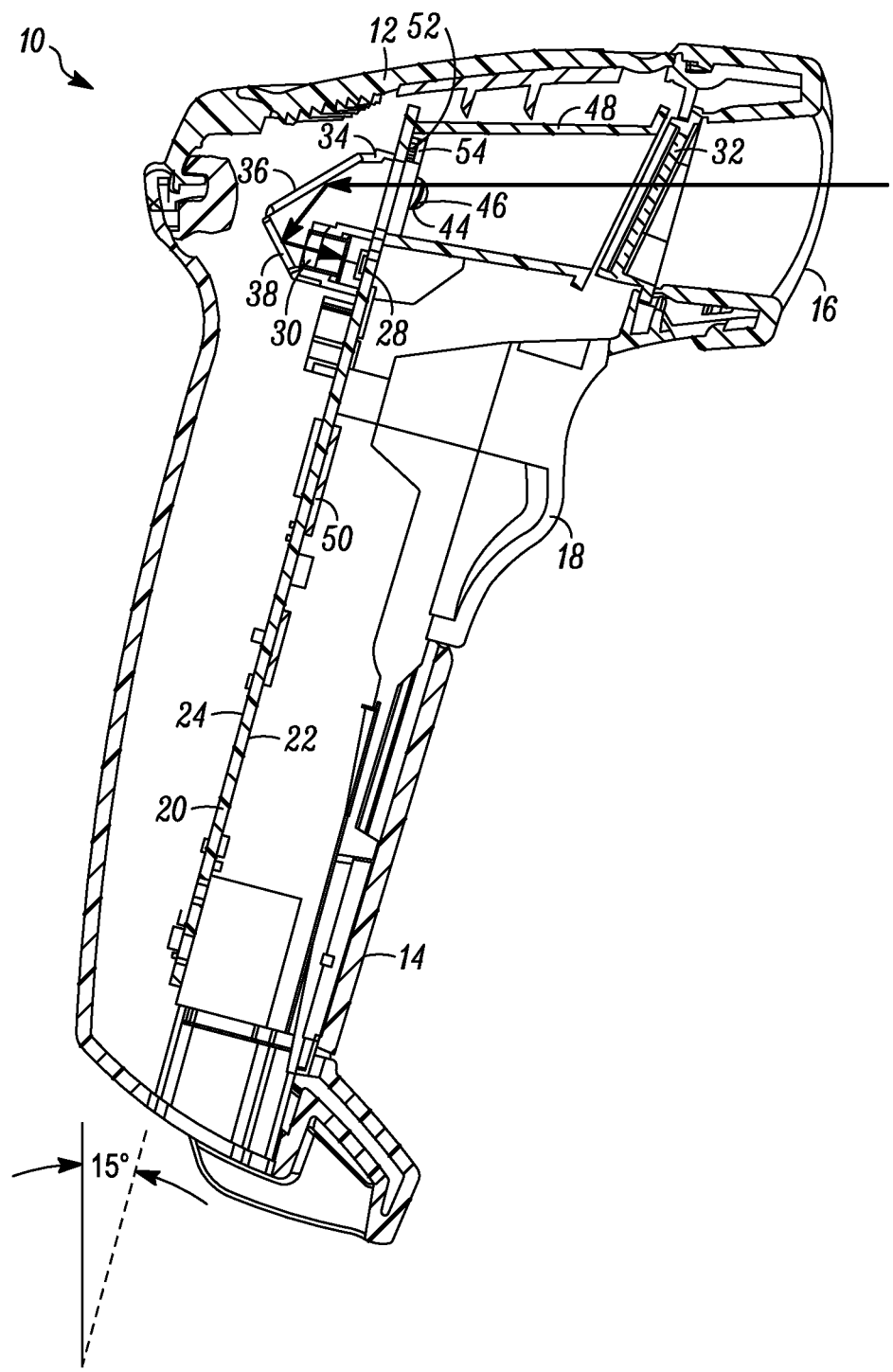
FIG. 2 is a sectional view of the reader of FIG. 1, showing one embodiment of internal components mounted on a single PCB.
Figure 3:
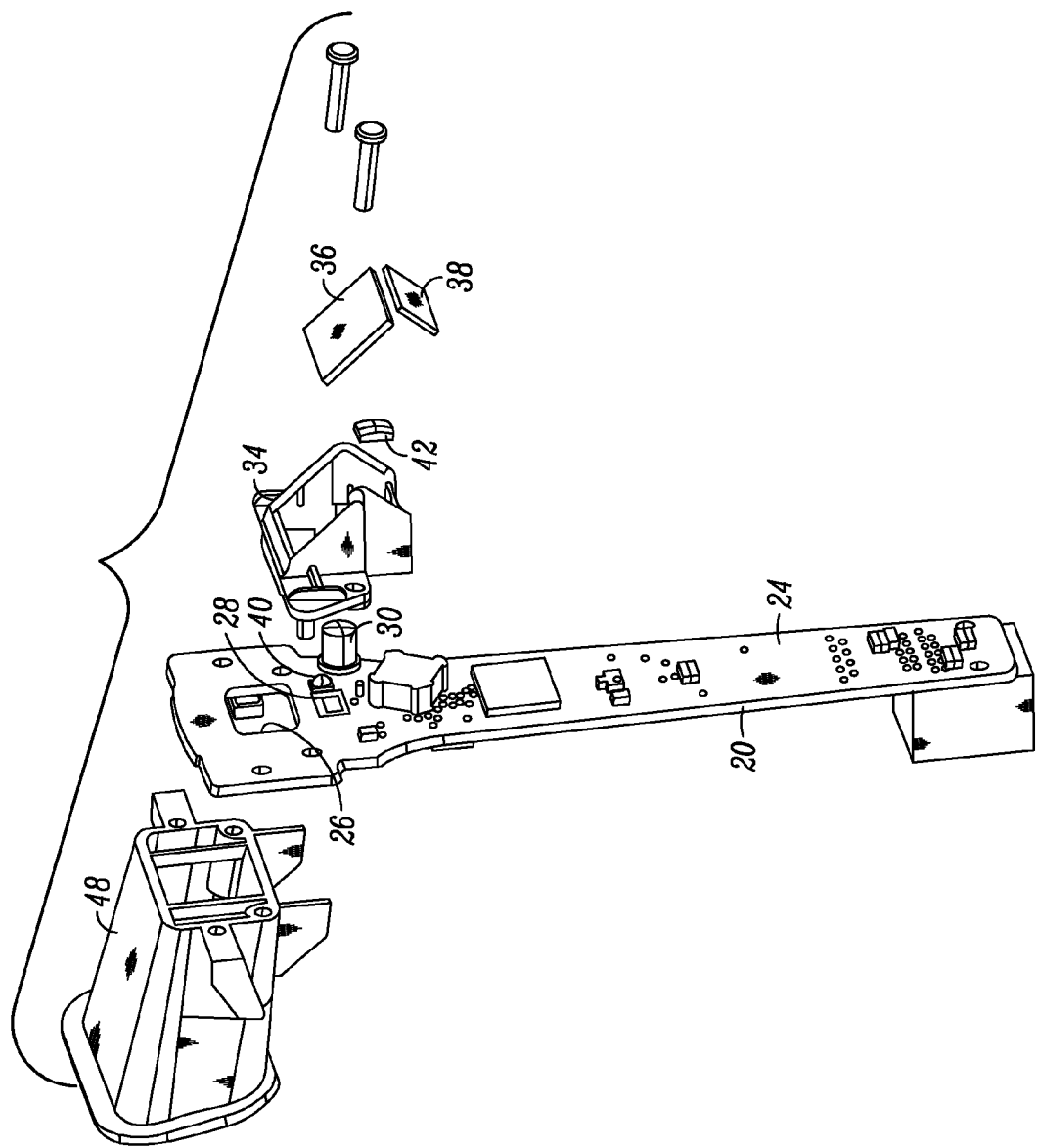
FIG. 3 is an exploded view of the internal components of FIG. 2, as seen from a rear side of the PCB.

Turning now to the drawings, reference numeral 10 in FIG. 1 generally identifies an exemplary ergonomic handheld imaging reader configured as a gun-shaped housing having an upper barrel or body 12 and a lower handle 14 tilted rearwardly away from the body 12 at an acute angle of inclination, for example, an angle somewhere between twenty-two and fifteen degrees (as shown, fifteen degrees), relative to the vertical. A window 32 (see FIG. 2) is located adjacent the front or nose 16 of the body 12 and is preferably also tilted relative to the vertical. The imaging reader 10 is held in an operator's hand by the handle 14 and used in a handheld mode in which a trigger 18 is manually depressed to initiate imaging of targets to be read in a range of working distances relative to the nose 16. The targets include symbol targets, such as one- and two-dimensional bar code symbols, as well as non-symbol targets or forms, such as documents, labels, receipts, signatures, drivers' licenses, employee badges, and payment/loyalty cards, each bearing alphanumeric characters. The illustrated gun-shaped housing can also be supported in a stand or cradle in a hands-free mode of operation. Housings of other configurations can also be employed.

As shown in FIGS. 2-5, the reader 10 includes a scan engine having a single printed circuit board (PCB) 20 mounted in the handle 14 and tilted at the same acute angle of inclination, e.g., fifteen degrees. The PCB 20 has a tilted front surface 22 (see FIG. 4) that faces the target and the window 32 during imaging, and a tilted rear surface 24 (see FIG. 3) that faces away from the window 32 and away from the target during imaging. The PCB 20 has an aperture 26, preferably, but not necessarily, generally rectangular, that extends entirely through the PCB 20 between the tilted front and rear surfaces 22, 24. As described below, return light scattered and/or reflected from the target enters the reader 10 through the window 32 and through the aperture 26 along the horizontal.

The scan engine also has a solid-state image sensor 28, for example, a CCD or a CMOS device having an area or two-dimensional sensor array of addressable image sensors or pixels lying in a plane and looking out over a field of view, and being rearwardly mounted on the tilted rear surface 24. As explained in detail below, this is in contrast with prior art configurations where the image sensor 28 is frontwardly mounted on a PCB and faces forwardly toward the window and the target.

The scan engine also has an imaging lens assembly 30 consisting of a plurality of imaging lenses arranged along an imaging axis in a tubular holder. The imaging lens assembly 30 is operative for capturing and projecting return light returning from the target, as described below, onto the image sensor 28.

The scan engine also has an optical assembly mounted on the tilted rear surface 24, and operative for directing the return light passing through the window 32 and through the aperture 26 along a folded path. The optical assembly includes a chassis 34 mounted on the tilted rear surface 24, and a pair of planar fold mirrors 36, 38 mounted on the chassis 34 and operative for folding the return light twice along the folded path. Fold mirror 36 is juxtaposed with the aperture 26 and folds the return light passing along the horizontal through the aperture 36 generally downwardly to the fold mirror 38. The fold mirror 38 is juxtaposed with the imaging lens assembly 30 and is operative for folding the return light from the fold mirror 36 to the imaging lens assembly 30. The fold mirrors 36, 38 are arranged relative to each other at an obtuse angle of about 97.5 degrees. This allows the return light to pass through the window 32 and the aperture 26 along the horizontal, whereupon the double-folded path allows the return light to pass along the imaging axis of the imaging lens assembly in a direction generally perpendicular to the image sensor 28, which is surface-mounted on the PCB 20 that, as noted above, is tilted at fifteen degrees. Rather than using two fold mirrors, a triangular prism could be employed.

As previously noted, the image sensor in the prior art handheld reader is typically forwardly-facing and is positioned about 2.5 inches back from the nose 16 of the housing. This internal optical path length is a relatively short distance and causes the field of view to diverge over a wide angle, e.g., on the order of forty degrees. One aspect of this disclosure is to deliberately position the image sensor 38 to face the rear of the housing and to double-fold the internal optical path up and over the image sensor 28 using the two mirrors 36, 38. No other handheld reader points the image sensor 38 backwards and folds the internal optical path like this. The result is that the internal optical path length has been approximately doubled to, e.g., about five inches and more. The internal optical path length can be adjusted by mounting the imaging lens assembly 30 anywhere along the internal optical path between the image sensor 28 and the window 32. In the exemplary embodiment depicted in FIG. 11 and described in detail below, the imaging lens assembly 30 is mounted between the two fold mirrors 36, 38.

Figure 7:
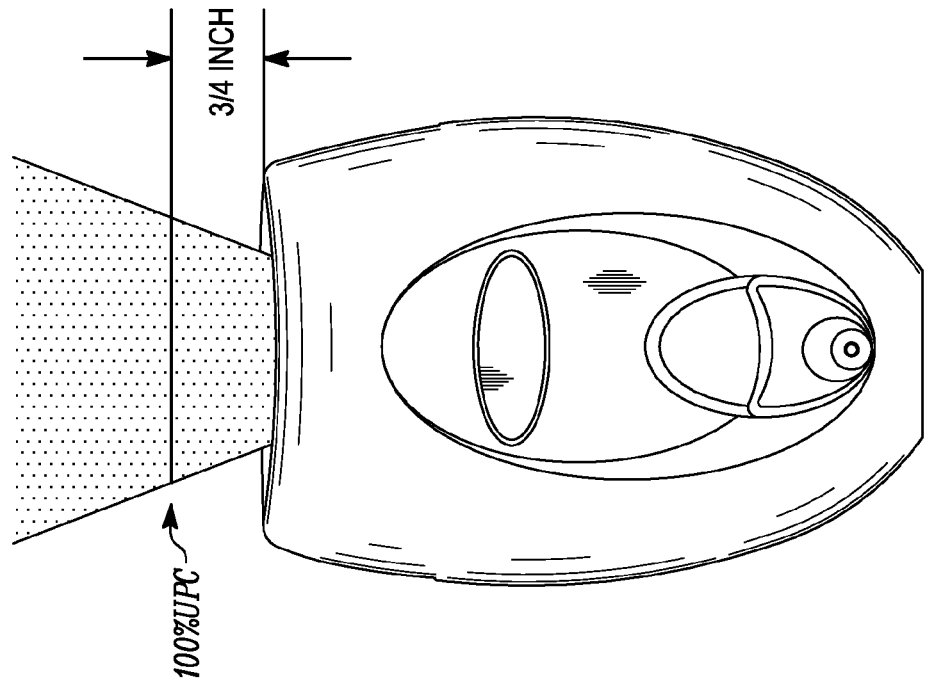
FIG. 7 is a top plan view diagrammatically depicting the size and location of the imaging field of view at the front end of the reader of FIG. 1.
Figure 8:
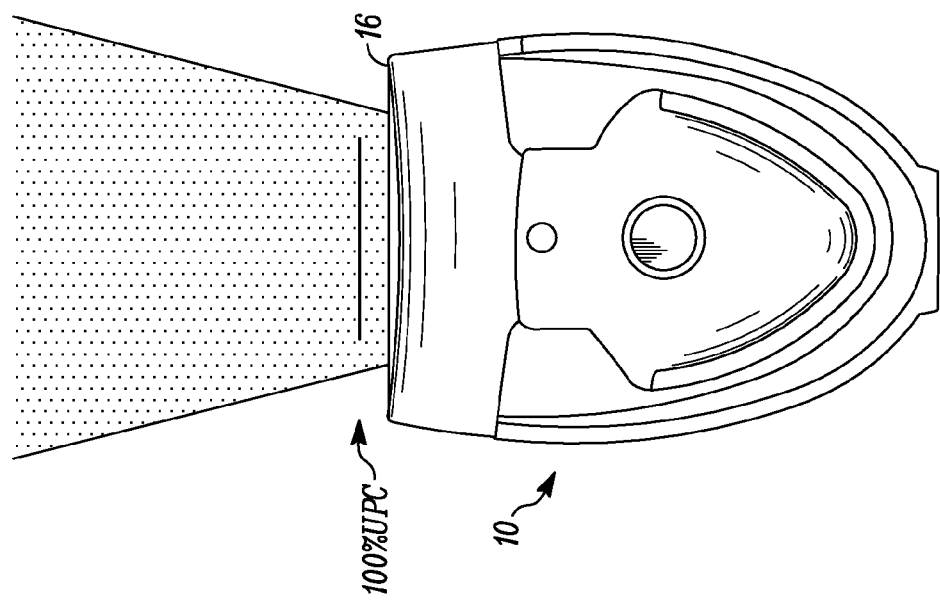
FIG. 8 is a top plan view analogous to FIG. 7 for a reader according to the prior art.

With the internal path length so doubled and lengthened, the field of view angle can be halved while still achieving the required 1.75 inch field of view width near the nose 16 of the housing. Thus, with reference to FIGS. 7 and 8, the reader 10 (FIG. 7) and its field of view adjacent the nose 16 is compared with that of a prior art reader (FIG. 8). A 100% Universal Product Code (UPC) symbol having a length of about 1.75 inches will be entirely covered at the nose 16 of the reader 10, whereas, by contrast, that same symbol will only be covered at a distance of about 0.75 inches away from the nose of a prior art reader. The reader 10 thus has a wider field of view adjacent the nose 16.

Figure 10:
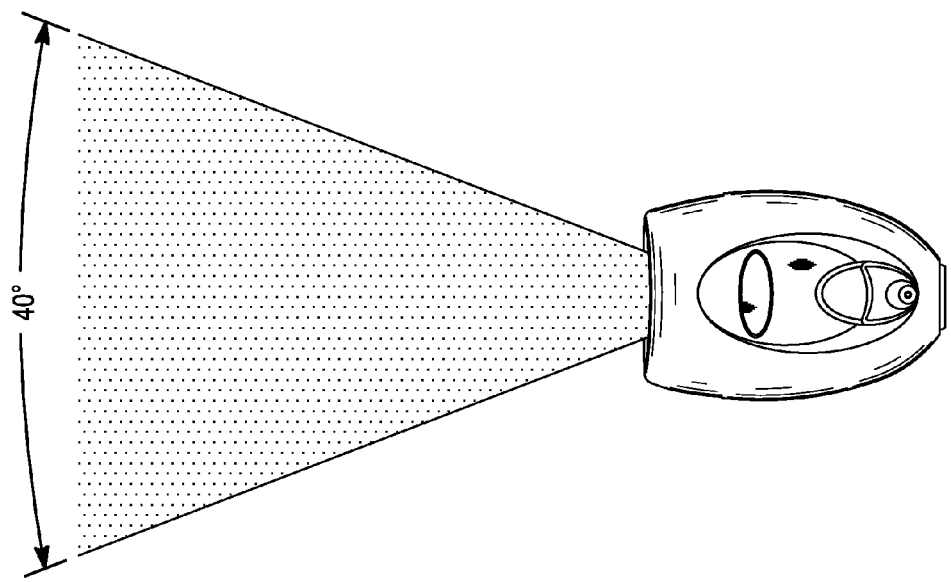
FIG. 10 is a top plan view analogous to FIG. 9 for a reader according to the prior art.
Figure 9:
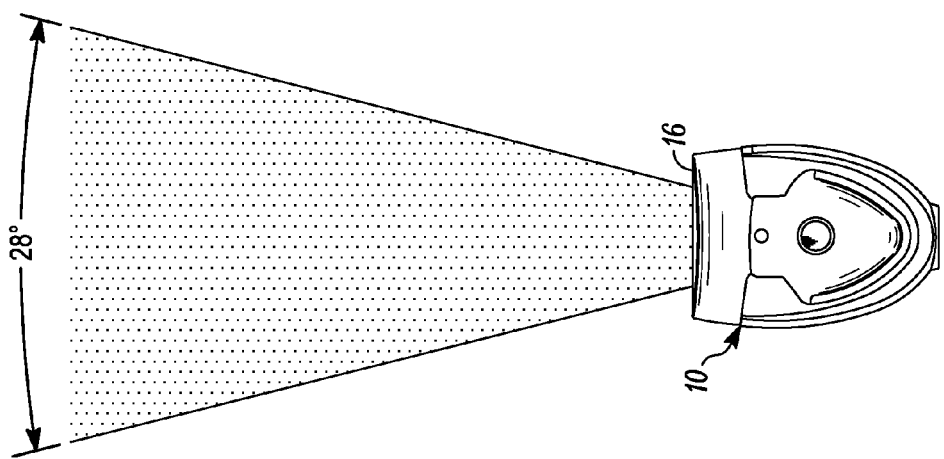
FIG. 9 is a top plan view diagrammatically depicting the size and location of the imaging field of view at a far end of a working distance range for the reader of FIG. 1.

With half the field of view angle, the size of the target image on the image sensor 28 only decreases at half of the rate as the target is moved away from the nose 16, with the result that the distance from the imaging lens assembly 30 can be doubled before the pixel resolution drops too low to read a target with elements of a given size. With reference to FIGS. 9 and 10, the reader 10 (FIG. 9) and its field of view (about twenty-eight degrees) far from the nose 16 is compared with that of a prior art reader (FIG. 10) and its field of view (about forty degrees). The narrower field of view of the reader 10 allows for more concentrated illumination light to be available at the far end of the working distance range. As discussed above, the pixel resolution limit is pushed out further from the nose 16. Also, the field of view of the reader 10 at the far end of the working distance range is not inconveniently large.

In addition, since the internal optical path is longer than that which has been used in prior art readers, the depth of focus has therefore been increased, and the point of best focus can be moved further away from the nose 16 of the housing while still retaining adequate image sharpness near the nose 16 to read targets placed close to the nose 16. In other words, a doubling of the internal optical path length results in more than doubling the distance between the imaging lens assembly 30 and the point of best focus, thereby providing a very significant increase in overall depth of focus. When this increased depth of focus is combined with the extended pixel resolution described above, the overall working range of the reader of this disclosure becomes dramatically increased, as compared to imaging readers of conventional design.

Figure 6:
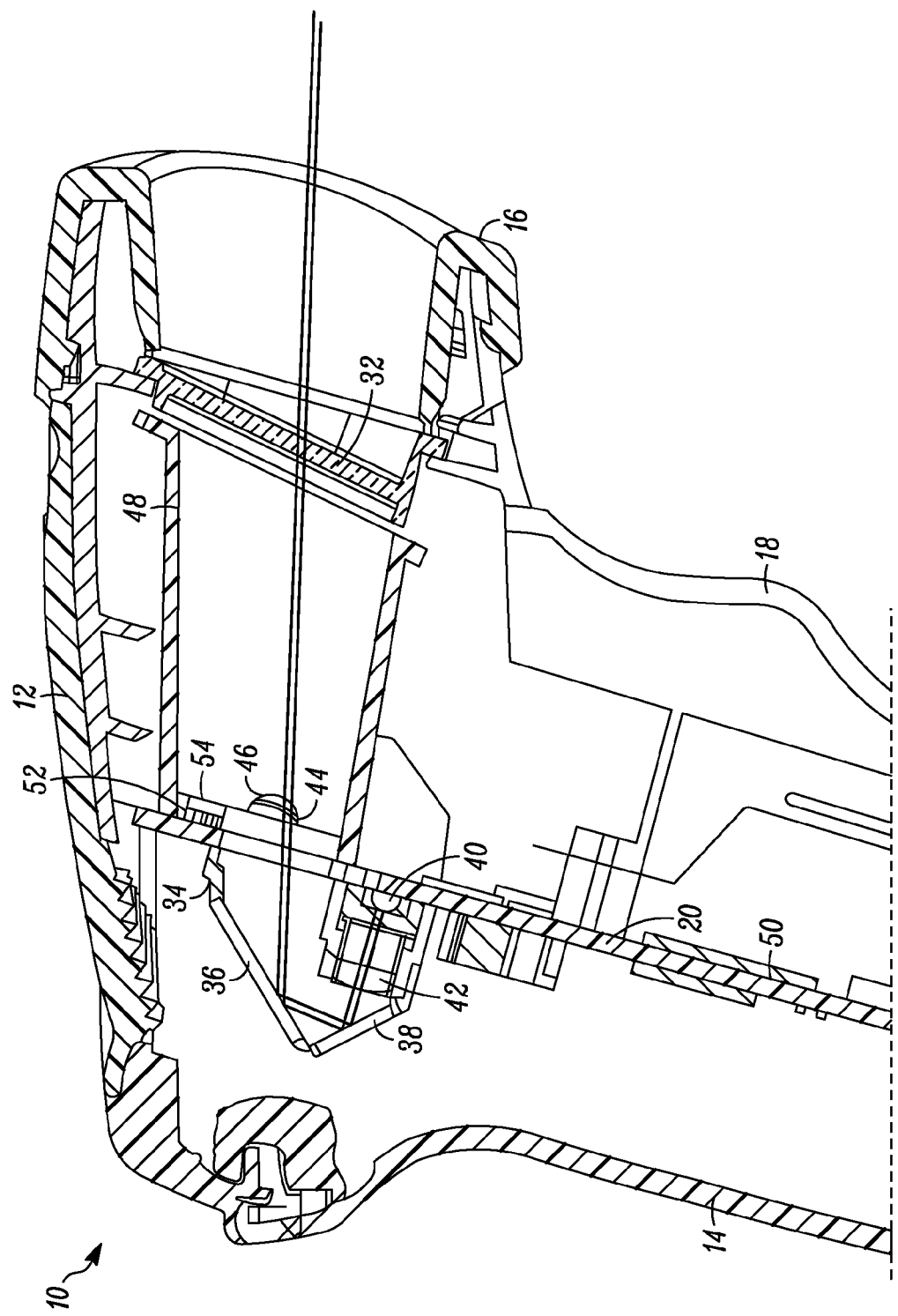
FIG. 6 is an enlarged broken-away view analogous to FIG. 2, showing the folded path of the aiming light.

As best seen in FIG. 6, the scan engine also has an aiming light assembly also mounted in the housing and operative for projecting an aiming light pattern or mark, such as a "crosshair" pattern, by employing an aiming light source 40, e.g., an aiming laser or LED, also mounted on the rear surface 24 of the PCB 20, for emitting an aiming light beam through an aiming lens 42 supported by the chassis 34 for optically modifying the aiming light beam, to the same pair of fold mirrors 38, 36 for twice folding the aiming light beam prior to passing through the aperture 26 and the window 32 to the target. The user aims the aiming pattern on the target to be imaged, prior to reading. By employing the same pair of fold mirrors 38, 36 for the return light and for the aiming beam, the above-described parallax issue is minimized.

The twice-folded aiming light beam increases the distance between the aiming light assembly and a target positioned out in front of the nose 16. This increased optical path length allows a reduction in the above-described parallax issue between the imaging field of view and the aiming light beam. With the extended optical path created by the twice-folded aiming light beam, the angular parallax is reduced, so that the aiming light beam remains well centered within the field of view of the image sensor 28 over a range that is larger than any other imaging reader.

In order to take full advantage of the extended depth of focus and extended pixel resolution of this disclosure, the scan engine also preferably has an illuminating light assembly also mounted in the housing of the imaging reader and preferably including a plurality of illuminating light sources, e.g., light emitting diodes (LEDs) 44 and illuminating lenses 46 arranged to uniformly illuminate the target with illumination light. If ambient illumination is too dim, the reader may not be able to decode a symbol target, or clearly image a non-symbol target, all the way out to the point where either the pixel resolution or the depth of focus runs out of range. The result would be failure to take maximum advantage of this disclosure. Hence, the illumination LEDs 44 are mounted on the front surface 22 (see FIG. 4) of the PCB 20, and shine directly out through the window 32. This places the illumination LEDs 44 a couple of inches closer to the target than the image sensor 28, thereby providing more intense illumination on the target.

In prior art readers, where a wide field of view angle is required, for reasons described above, the illuminating light assembly must project a wide cone of light to illuminate the entire field of view. Spreading the light over a wide area diminishes the intensity of the illumination light in any given portion of the field of view. In accordance with this disclosure, however, since the field of view angle is narrower than heretofore, the illuminating lenses 46 on the illumination LEDs 44 can be designed to project a much narrower angle of illumination, thereby increasing the intensity of the illumination light.

In further accordance with this disclosure, the illuminated area is blocked where it would extend beyond the edge of the imaging field of view by an internal chamber 48 mounted on the front surface 22 of the PCB 20 and extending from the PCB 20 to the window 32. The result is the projection of a bright rectangle of illumination light that corresponds quite closely with the actual imaging field of view. This supplements the aiming light assembly described above. The aiming light assembly can be used to designate a particular target positioned within the field of view, while the sharply cut off illumination helps a user see where the invisible field of view ends, thus avoiding failure to scan due to a portion of the target being positioned outside the field of view. The sharply cut-off illumination also masks the bright illumination from the eyes of people in the vicinity of the reader, thus avoiding one of the disadvantages of imager sensors, whose very bright illumination can be annoying to users and people nearby.

Figure 4:
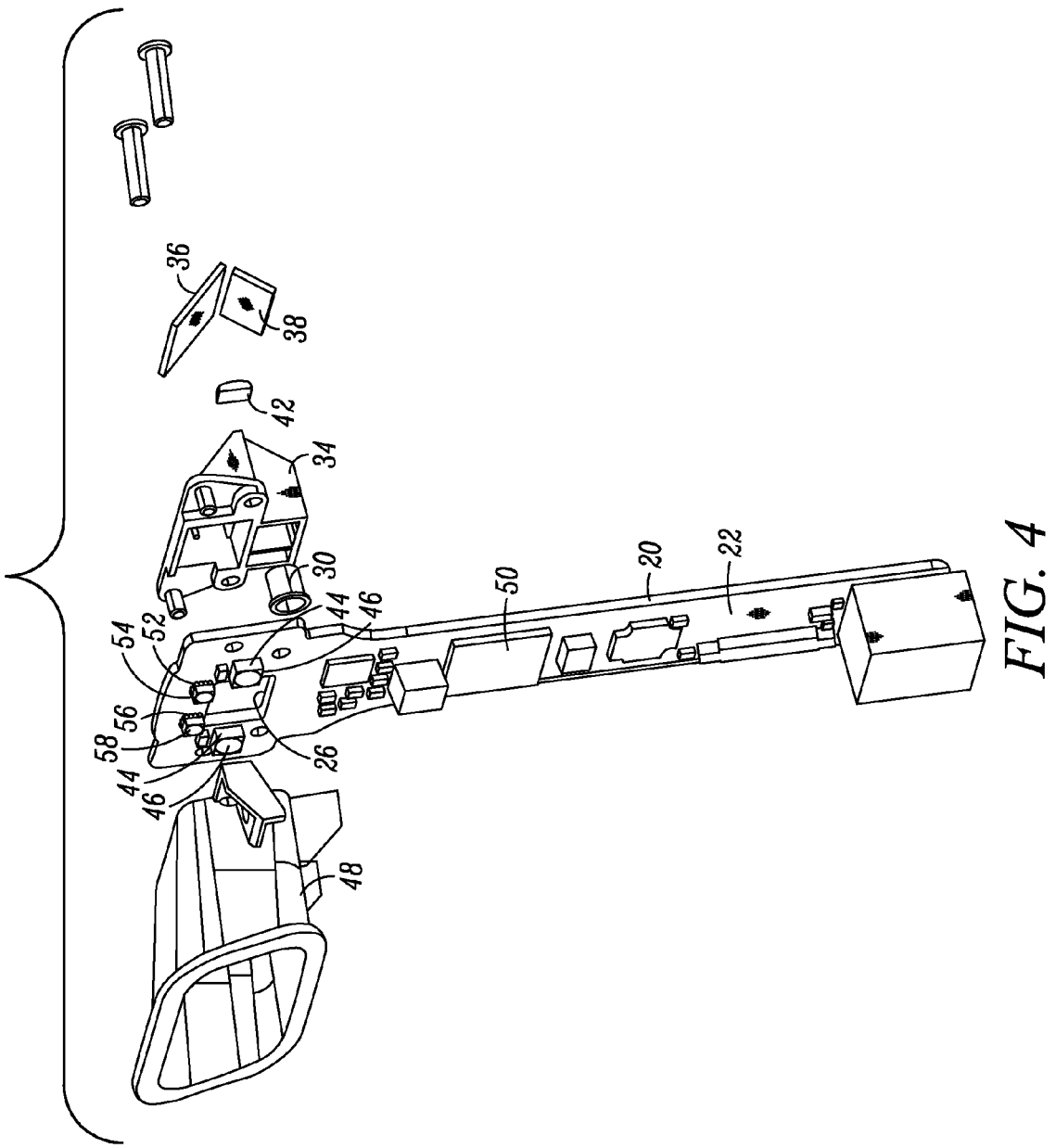
FIG. 4 is an exploded view of the internal components of FIG. 2, as seen from a front side of the PCB.
Figure 5:
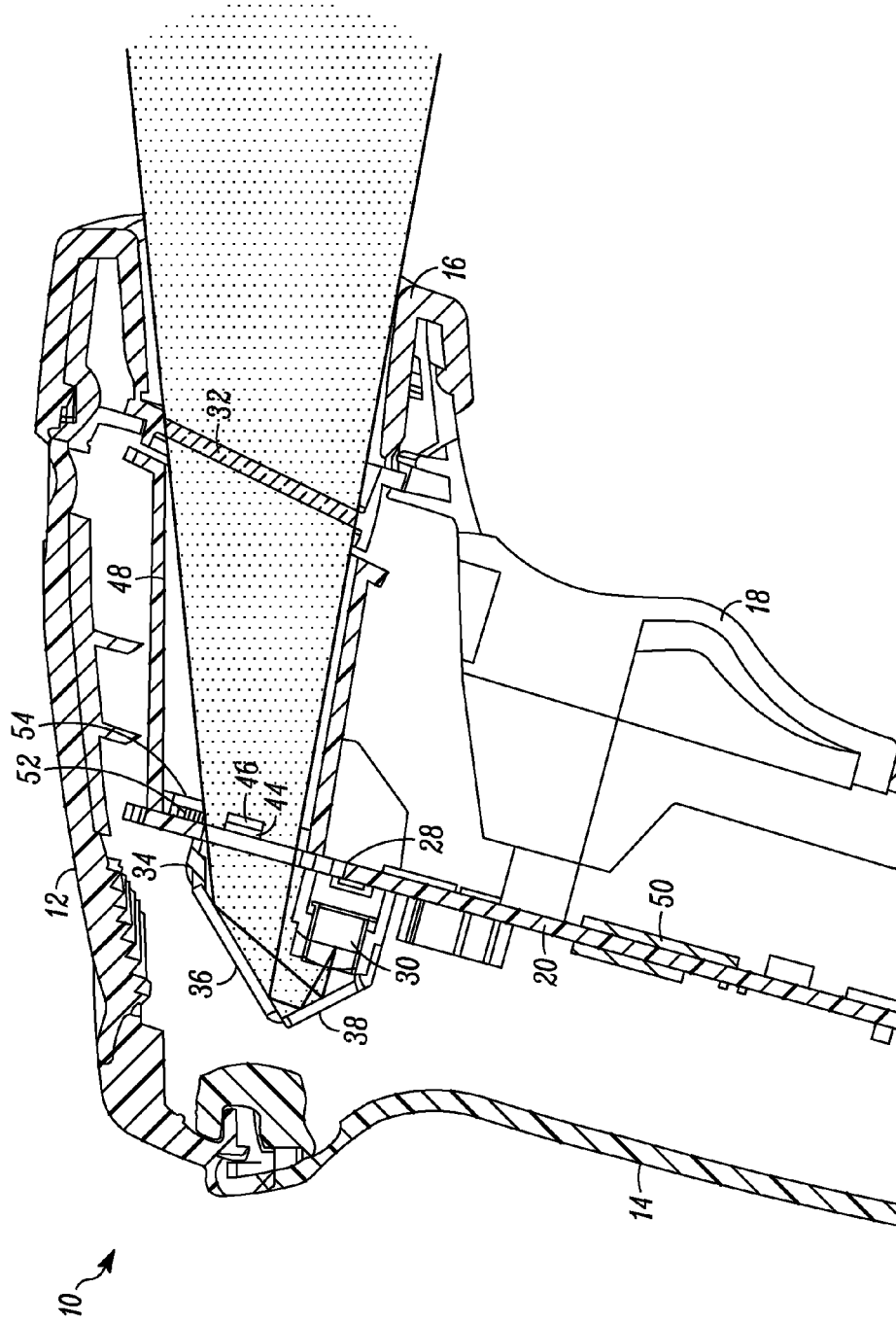
FIG. 5 is an enlarged broken-away view analogous to FIG. 2, showing the folded path of the imaging field of view.

As previously described, the trigger 18 is manually depressed to initiate imaging of targets to be read in the handheld mode of operation. Sometimes, as best seen in FIG. 4, the scan engine may optionally be provided with an object sensing assembly mounted on the front surface 22 and operative for sensing the target in the field of view through the window 32 in a hands-free mode of operation. The object sensing assembly includes an infrared emitter 52 and an infrared detector 56 spaced apart from each other on the PCB 20 within the chamber 48, and a pair of object lenses 54, 58, one for each infrared emitter 52 and detector 56.

The image sensor 28, the illuminating LEDs 44 of the illuminating assembly, the aiming light source 40 of the aiming light assembly, and the optional infrared emitter 52 and infrared detector 56 are operatively connected to a controller or programmed microprocessor 50 operative for controlling the operation of these components. Preferably, the microprocessor 50 is the same as the one used for decoding return light scattered from a symbol target and/or for processing the captured target images.

In operation, the microprocessor 50 sends command signals to energize the aiming light source 40 to project the aiming light pattern on the target, to energize the illuminating LEDs 44 for a short time period, say 500 microseconds or less to illuminate the target, and also to energize the image sensor 28 to collect light from the target only during said time period. A typical array needs about 16 to 33 milliseconds to acquire the entire target image and operates at a frame rate of about 30 to 60 frames per second. The array may have on the order of one million addressable image sensors.

Figure 11:
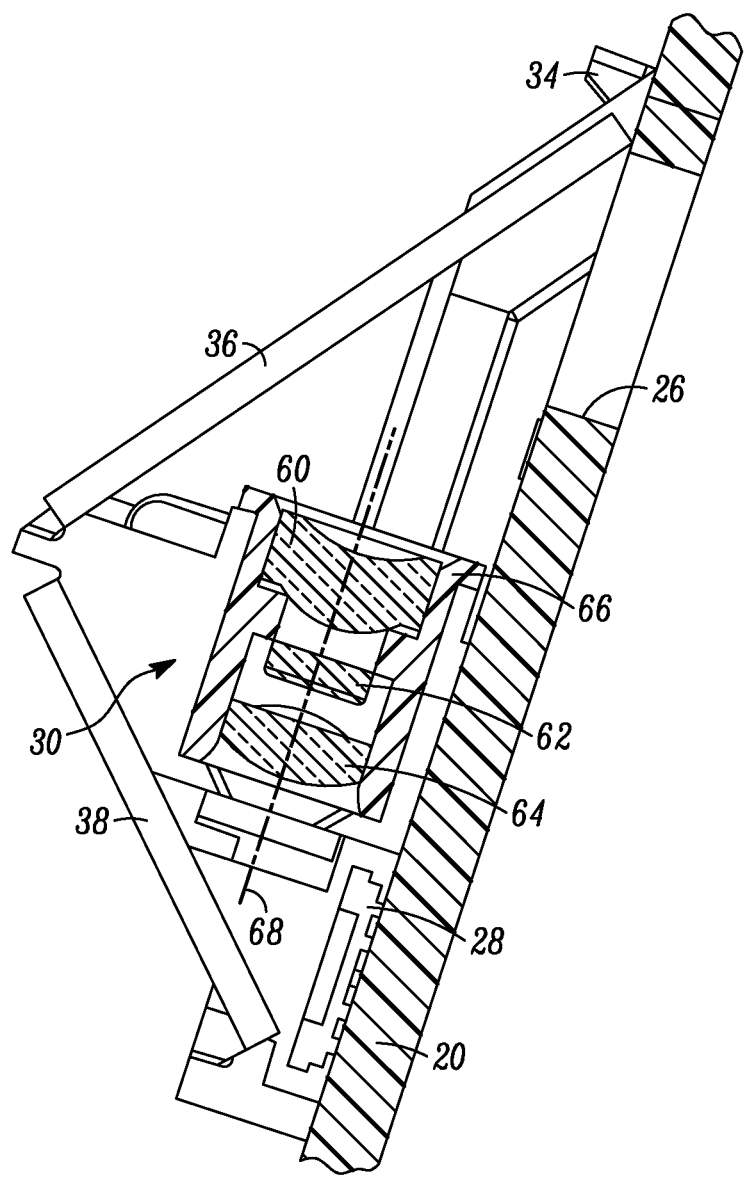
FIG. 11 is an enlarged sectional view of a detail of the reader of FIG. 2, showing another embodiment of internal components mounted on a single PCB.

As best seen in FIG. 11, the above-described imaging lens assembly 30 preferably consists of a Cooke triplet having lenses 60, 62, 64 spaced apart along an imaging axis 68, or in close proximity with one another, and mounted in a tubular cylindrical holder 66. The imaging lens assembly 30 could also be a doublet. Other lenses could be added. An aperture stop could also be positioned between any two adjacent lenses. The imaging lens assembly 30 is mounted in the internal folded path between the above-described fold mirrors 36, 38. The imaging axis 68 is positioned to be generally parallel, and close, to the tilted PCB 20. This is in contrast with the above-described embodiment where the imaging axis 68 is positioned to be generally perpendicular to the tilted PCB 20. The generally parallel, and close, positioning of the imaging axis 68 relative to the tilted PCB 20 renders the scan engine of FIG. 11 more compact than in the previous embodiment.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors, and field programmable gate arrays (FPGAs), and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein, will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. A compact scan engine for electro-optically imaging a target, comprising:
   a single printed circuit board (PCB) tilted at an acute angle of inclination relative to the vertical, the PCB having a tilted front surface that faces the target during imaging, and a tilted rear surface that faces away from the target during imaging, the PCB having an aperture that extends through the PCB between the tilted front and rear surfaces;
   a solid-state image sensor mounted on the tilted rear surface and having a two-dimensional sensor array with a field of view;
   an optical assembly on the tilted rear surface and including a pair of fold mirrors arranged relative to each other and relative to the image sensor, for receiving return light returning from the target and passing through the aperture along the horizontal, and for directing the return light along a folded path; and
   an imaging lens assembly mounted in the folded path between the fold mirrors and having an imaging axis that extends generally parallel to the PCB, for projecting the return light onto the image sensor to enable the image sensor to detect the return light over the field of view, and to generate an electrical signal indicative of the detected return light.

2. The scan engine of claim 1, wherein the optical assembly includes a chassis mounted on the tilted rear surface, and wherein the fold mirrors and the imaging lens assembly are mounted on the chassis and are operative for folding the return light twice along the folded path, one of the fold mirrors being operative for folding the return light passing through the aperture through the imaging lens assembly to the other of the fold mirrors, and the other of the fold mirrors being operative for folding the return light from the imaging lens assembly to the image sensor.

3. The scan engine of claim 2, wherein each fold mirror is planar, and wherein the chassis holds the planar fold mirrors at an obtuse angle relative to each other.

4. The scan engine of claim 2, wherein the imaging lens assembly includes a plurality of imaging lenses arranged along the imaging axis.

5. The scan engine of claim 2, and an aiming light assembly mounted on the tilted rear surface, for directing an aiming pattern onto the same fold mirrors, and for projecting the aiming pattern on the target, wherein the aiming light assembly includes an aiming light emitting diode (LED) mounted on the tilted rear surface and operative for emitting an aiming light beam through an aiming lens supported by the chassis for optically modifying the aiming light beam, and to the same pair of fold mirrors, for twice folding the aiming light beam prior to passing through the aperture to the target.

6. A reader for electro-optically reading a target, comprising:
   a housing having a front end, a light-transmissive window supported at the front end, and a handle for holding the housing in a handheld mode of operation, the handle being tilted at an acute angle of inclination relative to the vertical;
   a compact scan engine for imaging the target, the scan engine including a single printed circuit board (PCB) mounted in the handle and tilted at the same acute angle of inclination, the PCB having a tilted front surface that faces the target during imaging, and a tilted rear surface that faces away from the target during imaging, the PCB having an aperture that extends through the PCB between the tilted front and rear surfaces, a solid-state image sensor mounted on the tilted rear surface and having a two-dimensional sensor array with a field of view, an optical assembly having a pair of fold mirrors mounted on the tilted rear surface for receiving return light returning from the target through the window and passing through the aperture along the horizontal, and for directing the return light along an internal folded path between the window and the image sensor, and an imaging lens assembly mounted in the internal folded path between the fold mirrors and having an imaging axis that extends generally parallel to the PCB, and operative for projecting the return light onto the image sensor to enable the image sensor to detect the return light over the field of view, and to generate an electrical signal indicative of the detected return light; and
   a controller mounted on the PCB and operatively connected to, and controlling operation of, the scan engine, for processing the electrical signal into data indicative of the target being imaged.

7. The reader of claim 6, wherein the optical assembly includes a chassis mounted on the tilted rear surface, and wherein the fold mirrors and the imaging lens assembly are mounted on the chassis and are operative for folding the return light twice along the internal folded path, one of the fold mirrors being operative for folding the return light passing through the window and the aperture through the imaging lens assembly and to the other of the fold mirrors, and the other of the fold mirrors being operative for folding the return light from the imaging lens assembly to the image sensor.

8. The reader of claim 7, wherein each fold mirror is planar, and wherein the chassis holds the planar fold mirrors at an obtuse angle relative to each other.

9. The reader of claim 7, wherein the imaging lens assembly includes a plurality of imaging lenses arranged along the imaging axis.

10. The reader of claim 7, and an aiming light assembly for projecting an aiming pattern on the target, the aiming light assembly including an aiming light emitting diode (LED) mounted on the tilted rear surface and operative for emitting an aiming light beam through an aiming lens supported by the chassis for optically modifying the aiming light beam, and to the same pair of fold mirrors, for twice folding the aiming light beam prior to passing through the aperture and the window to the target.

11. The reader of claim 6, and a light chamber mounted on the tilted front surface and extending between the PCB and the window.

12. The reader of claim 6, wherein the acute angle of inclination is from about fifteen degrees to about twenty-two degrees.

13. The reader of claim 6, and a trigger mounted on the handle, for manually actuating reading.

14. A method of electro-optically reading a target, comprising:
- supporting a light-transmissive window at a front end of a housing;
- holding the housing in a handheld mode of operation with a handle tilted at an acute angle of inclination relative to the vertical;
- mounting a single printed circuit board (PCB) in the handle and tilting the PCB at the same angle of inclination, the PCB having a tilted front surface that faces the target during imaging, and a tilted rear surface that faces away from the target during imaging;
- forming an aperture to extend through the PCB between the tilted front and rear surfaces;
- mounting a solid-state image sensor having a two-dimensional sensor array with a field of view on the tilted rear surface;
- receiving return light returning from the target through the window and passing through the aperture along the horizontal, and directing the return light along an internal folded path between the window and the image sensor by mounting a pair of fold mirrors on the tilted rear surface;
- projecting the return light onto the image sensor by mounting an imaging lens assembly in the internal folded path between the fold mirrors, and by positioning an imaging axis of the imaging lens assembly to extend generally parallel to the PCB, to enable the image sensor to detect the return light over the field of view, and to generate an electrical signal indicative of the detected return light; and
- processing the electrical signal into data indicative of the target being imaged.

15. The method of claim 14, and mounting the fold mirrors and the imaging lens assembly on a chassis mounted on the tilted rear surface.

16. The method of claim 15, and projecting an aiming pattern on the target with an aiming light emitting diode (LED) mounted on the tilted rear surface to emit an aiming light beam to the same pair of fold mirrors for twice folding the aiming light beam prior to passing through the aperture and the window to the target.

17. The method of claim 14, and orienting the fold mirrors at an obtuse angle relative to each other.

18. The method of claim 14, and configuring the imaging lens assembly with a plurality of lenses that extend along the imaging axis.

19. The method of claim 14, and orienting the fold mirrors and the imaging lens assembly relative to each other and relative to the image sensor so that the return light passes through the window and the aperture along the horizontal.

20. The method of claim 14, and mounting a light chamber on the tilted front surface between the PCB and the window.

* * * * *